United States Patent
Kouchi et al.

[11] Patent Number: 6,084,895
[45] Date of Patent: Jul. 4, 2000

[54] SEMICONDUCTOR LASER APPARATUS

[75] Inventors: Yasuyuki Kouchi; Akira Ueno, both of Osaka; Hideyuki Nakanishi, Shiga; Akio Yoshimura, Osaka, all of Japan

[73] Assignee: Matsushita Electronics Corporation, Osaka, Japan

[21] Appl. No.: 08/904,304

[22] Filed: Jul. 31, 1997

[30] Foreign Application Priority Data

Aug. 2, 1996 [JP] Japan .................................. 8-204570

[51] Int. Cl.[7] .................................................. H01S 3/043
[52] U.S. Cl. .................................................. 372/36; 372/50
[58] Field of Search ........................ 372/36, 50; 437/189; 357/81; 257/94; 438/447

[56] References Cited

U.S. PATENT DOCUMENTS

| | | | |
|---|---|---|---|
| 3,891,469 | 6/1975 | Moriyama et al. | 438/447 |
| 5,270,253 | 12/1993 | Arai et al. | 437/189 |
| 5,479,426 | 12/1995 | Nakanishi et al. | |
| 5,608,749 | 3/1997 | Kizuki | 372/36 |
| 5,729,561 | 3/1998 | Hironaka | 372/36 |

FOREIGN PATENT DOCUMENTS

| | | |
|---|---|---|
| 02138785 | 5/1990 | Japan . |
| 04286178 | 10/1992 | Japan . |
| 06203403 | 7/1994 | Japan . |

*Primary Examiner*—James W. Davie
*Attorney, Agent, or Firm*—McDermott, Will & Emery

[57] ABSTRACT

A semiconductor laser element which is composed of a compound semiconductor consisting of GaAs or the like, a silicon laser mount which is disposed beneath the semiconductor laser element so as to position the element, and on which an electrode layer as an electrode for the semiconductor laser element is formed, a heat sink which is disposed beneath the laser mount so as to dissipate, through the laser mount, the heat generated by the semiconductor laser element are mutually secured through hot contact bonding. The laser mount has a concave portion on the side opposite to its main surface on which the semiconductor layer element is secured, and the concave portion contains a heat dissipating body which is integrated thereinto and is made of copper having higher thermal conductivity than silicon.

10 Claims, 11 Drawing Sheets

SEMICONDUCTOR LASER APPARATUS

BACKGROUND OF THE INVENTION

The present invention relates to a semiconductor laser apparatus to be used in the fields of optical information processing, optical measurement, optical communication, and the like.

The following is a description of semiconductor laser apparatuses of prior art, based on the drawings.

First Prior Art

FIG. 13 is a section view illustrating the arrangement of the semiconductor laser apparatus of first prior art. As shown in FIG. 13, the apparatus comprises a semiconductor laser element 101 which is composed of a compound semiconductor consisting of GaAs or the like, a laser mount 102 which is disposed beneath the semiconductor laser element 101 so as to position the element 101, and a heat sink 103 which is disposed beneath the laser mount 102 so as to dissipate the heat generated by the semiconductor laser element 101 through the laser mount 102. These members 101, 102, and 103 are mutually secured through hot contact bonding with the use of solder or the like. Since the semiconductor laser element 101 and the laser mount 102 are different in coefficient of thermal expansion, stress is generated in the laser mount 102 with respect to the semiconductor laser element 101. To reduce this stress, the laser mount 102 is generally made of silicon or the like of which difference in coefficient of thermal expansion with respect to the semiconductor laser element 101 is small.

Second Prior Art

FIG. 14 is a section view illustrating the arrangement of the semiconductor laser apparatus of second prior art, which is disclosed in Japanese Laid-open Patent Application No. 6-203403, and which comprises a semiconductor laser element and circuit elements including an optical sensor and a signal processing circuit, all of them being provided on the substrate. As shown in FIG. 14, the apparatus comprises a heat sink 103, a silicon semiconductor substrate 112, which is disposed on the heat sink 103 and has a concave portion on the top thereof, the concave portion having inner walls so inclined as to form an inverse trapezoid, and a semiconductor laser element 101, which is disposed on the bottom surface of the concave portion of the semiconductor substrate 112. These members 103, 112, and 101 are mutually secured through hot contact bonding with the use of solder or the like.

Formed on a top of the concave portion of the semiconductor substrate 112 is an optical sensor 112a, which detects a light 104 externally incident thereupon. A reflection mirror 112b, which reflects a laser light 105, is formed on that inclined inner wall of the concave portion in the semiconductor substrate 112 which is located on the side of the optical sensor 112a. The laser light 105 is emitted from the semiconductor laser element 101 in a direction substantially parallel with the main surface of the semiconductor substrate 112 and reflected by the reflection mirror 112b in a direction substantially vertical to the main surface of the semiconductor substrate 112. A laser light sensor 112c, which monitors the operation of the semiconductor laser element 101, is formed on that inclined inner wall of the concave portion of the semiconductor substrate 112 which is located on the side opposite to the optical sensor 112a. By setting the angle of inclination of the inner walls of the concave portion so that the optical axis of the laser light 105 reflected by the reflection mirror 112b is substantially parallel with the optical axis of the externally incident light 104, the semiconductor laser apparatus can be efficiently combined with an external optical device. The semiconductor substrate 112 is further provided with such unillustrated members as an amplifier circuit for amplifying a signal supplied from the optical sensor 112a and outputting the amplified signal, an operating circuit for performing operation on the signal supplied from the amplifier circuit, and a drive circuit for driving the semiconductor laser element 101.

In the second prior art, too, the semiconductor laser element 101 is secured to the semiconductor substrate 112 which is made of silicon of which difference in coefficient of thermal expansion with respect to the semiconductor laser element 101 is small. Accordingly, the stress of the semiconductor substrate 112 with respect to the semiconductor laser element 101 is small.

Third Prior Art

FIG. 15 is a section view illustrating the arrangement of the semiconductor laser apparatus as third prior art. As shown in FIG. 15, a laser mount 113, which comprises an upper silicon layer 113a and a lower diamond layer 113b secured to each other, is disposed between a semiconductor laser element 101 and a heat sink 103. The upper silicon layer 113a is made of silicon having small difference in coefficient of thermal expansion with respect to the semiconductor laser element 101 and secured to the semiconductor laser element 101. The lower diamond layer 113b is made of diamond having thermal conductivity higher than silicon and secured to the heat sink 103. The upper silicon layer 113a functions to reduce the stress of the laser mount 113 with respect to the semiconductor laser element 101 while the lower diamond layer 113b functions to improve heat dissipation of the laser mount 113.

Fourth Prior Art

In the first to third prior art, the laser mount or the substrate which is in contact with the semiconductor laser element, is composed of a silicon semiconductor or the like having a small difference in coefficient of thermal expansion with respect to the semiconductor laser element. In addition to them, another method has been proposed to reduce the stress and improve the heat dissipation by using a material such as silicon carbide (SiC), aluminum nitride (AlN), or diamond (C), which has a small difference in coefficient of thermal expansion with respect to the semiconductor laser element and which is higher in thermal conductivity than a semiconductor (Japanese Laid-open Patent Application No. 2-138785).

However, the semiconductor laser apparatuses of the first and second prior art have a problem as follows. The laser mount 102 or 112, to which the semiconductor laser element 101 is secured, is composed of a semiconductor made of silicon or the like having relatively low thermal conductivity. Accordingly, the heat dissipation is so poor that the semiconductor laser element 101 is susceptible to heat, which disadvantageously shortens the expected lifetime of the semiconductor laser element 101.

The semiconductor laser apparatus of the third prior art has problems as follows. The upper silicon layer 113a and the lower diamond layer 113b, which compose the laser mount 113, come off from each other due to stress resulting from the difference in coefficient of thermal expansion therebetween. This results in insufficient heat dissipation of the semiconductor laser element 101, which causes the semiconductor laser element 101 to be deteriorated due to heat. In addition, more component elements are needed to separately produce and assemble the upper silicon layer 113a and the lower diamond layer 113b, and also a special machining device such as a laser cutter is required for the difficult machine of a sheet-like diamond, which increases the production cost.

The semiconductor laser apparatus of the fourth prior art also has a problem that the use of silicon carbide, aluminium nitride, diamond, or the like which is difficult to be machined due to its hardness increases the machining and production costs.

SUMMARY OF THE INVENTION

The present invention has an object of solving these problems of prior art and achieving both an improvement in heat dissipation and a reduction in stress due to a difference in coefficient of thermal expansion between the semiconductor laser element and the laser mount of a semiconductor laser apparatus.

In order to achieve the object, according to the present invention, a laser mount, on which a semiconductor laser element is secured, is provided with a concave portion that is filled with a heat dissipating body having high thermal conductivity.

Furthermore, a heat dissipating body layer with high thermal conductivity is provided between the semiconductor laser element and the laser mount.

A first semiconductor laser apparatus according to the present invention comprises a laser mount and a semiconductor laser element secured to the main surface of the laser mount. The laser mount has a concave portion on the side opposite to the main surface, and the concave portion contains a heat dissipating body which has higher thermal conductivity than the laser mount and which is integrated into the concave portion.

According to the first semiconductor laser apparatus, the laser mount has a concave portion on the side opposite to the main surface, on which the semiconductor laser element is secured, and the concave portion contains a heat dissipating body which has higher thermal conductivity than the laser mount and which is integrated into the concave portion. The heat dissipating body integrated into the concave portion improves the heat dissipation of the laser mount. In this case, the filling of the concave portion with the heat dissipating body facilitates the integrity of the laser mount and the heat dissipating body.

When the laser mount, which is in contact with the semiconductor laser element, is composed of a semiconductor, it serves to reduce the stress with respect to the semiconductor laser element, and facilitates to form the concave portion by photolithography.

In the first semiconductor laser apparatus, it is preferable that the dimension from the main surface to the bottom surface of the laser mount is between 20 $\mu$m and 100 $\mu$m, inclusive. This range of thickness ensures the improvement of the heat dissipation of the laser mount.

In the first semiconductor laser apparatus, it is preferable that the heat dissipating body is composed of a metal. When the laser mount is composed of a semiconductor, the use of a metal, which has higher thermal conductivity than the semiconductor, facilitates the process of the heat dissipating body and ensures the improvement of the heat dissipation of the laser mount.

A second semiconductor laser apparatus according to the present invention comprises a substrate, a semiconductor laser element, which is secured on the main surface of the substrate, and a light sensor, which is provided on the substrate and which detects a light incident from outside. The substrate has a concave portion on the side opposite to the main surface, and the concave portion contains a heat dissipating body, which has higher thermal conductivity than the substrate and which is integrated into the concave portion.

According to the second semiconductor laser apparatus, the substrate has a concave portion on the side opposite to the main surface, on which the semiconductor laser element is secured, and the concave portion contains a heat dissipating body which has higher thermal conductivity than the substrate and which is integrated into the concave portion. The heat dissipating body integrated into the concave portion improves the heat dissipation of the substrate. In this case, the filling of the concave portion with the heat dissipating body facilitates the integrity of the substrate and the heat dissipating body.

When the substrate, which is in contact with a semiconductor laser element, is composed of a semiconductor, it serves to reduce the stress with respect to the semiconductor laser element, and facilitates to form the concave portion by photolithography.

The second semiconductor laser apparatus preferably comprises a reflection mirror, which is formed on the substrate and reflects a laser light emitted from the semiconductor laser element, in a direction substantially vertical to the main surface of the substrate. The reflection mirror, together with the light sensor formed on the substrate in order to detect the light incident from outside, make the optical axis of the laser light reflected by the reflection mirror be substantially parallel with the optical axis of the light incident from outside. Consequently, the semiconductor laser apparatus is efficiently combined with an external optical device.

In the second semiconductor laser apparatus, it is preferable that the dimension from the main surface to the bottom surface of the substrate is between 20 $\mu$m and 100 $\mu$m, inclusive. This range of thickness ensures the improvement of the heat dissipation of the substrate.

In the second semiconductor laser apparatus, it is preferable that the heat dissipating body is composed of a metal. When the substrate is composed of a semiconductor, the use of a metal, which has higher thermal conductivity than the semiconductor, facilitates the process of the heat dissipating body and ensures the improvement of the heat dissipation of the substrate.

A third semiconductor laser apparatus according to the present invention comprises a heat dissipating body layer, which is formed on a laser mount and has higher thermal conductivity than the laser mount, and a semiconductor laser element, which is secured on the heat dissipating body layer.

According to the third semiconductor laser apparatus, the heat dissipating body layer whose thermal conductivity is higher than the laser mount is disposed between the laser mount and the semiconductor laser element. Consequently, the heat generated in the semiconductor laser element is absorbed by the heat dissipating body layer, and then dispersed in the direction of the heat dissipating body layer spreading so as to be widely dissipated into the laser mount. Therefore, the heat dissipation of the laser mount is enhanced.

In the third semiconductor laser apparatus, it is preferable that the thickness of the heat dissipating body layer is 50 $\mu$m or less. When the thickness is over 50 $\mu$m, the stress resulting from the difference in the coefficient of thermal expansion between the heat dissipating body layer and the semiconductor laser element grows, which deteriorates the semiconductor laser element. However, when the thickness is 50 μm or less, the influence of the differential thermal expansion is negligible.

In the third semiconductor laser apparatus, it is preferable that the heat dissipating body layer is composed of a metal. The use of a metal, which has higher thermal conductivity than the semiconductor, facilitates the process of the heat dissipating body layer and ensures the improvement of the heat dissipation of the laser mount.

In the third semiconductor laser apparatus, it is preferable that the constituent element of the heat dissipating body layer is carbon. For example, when diamond whose constituent element is carbon is used, the heat dissipation of the laser mount is further enhanced because diamond has higher thermal conductivity than a metal and smaller differential thermal expansion. In addition, the heat dissipating body layer which is in the form of a thin film can be produced and processed more easily.

A fourth semiconductor laser apparatus according to the present invention comprises a heat dissipating body layer, which is formed on the main surface of a substrate and has higher thermal conductivity than the substrate, a semiconductor laser element, which is secured on the heat dissipating body layer, and a light sensor, which is provided on the substrate and detects a light incident from outside.

According to the fourth semiconductor laser apparatus, the heat dissipating body layer whose thermal conductivity is higher than the substrate is disposed between the substrate and the semiconductor laser element. Consequently, the heat generated in the semiconductor laser element is absorbed by the heat dissipating body layer, and then dispersed in the direction of the heat dissipating body layer spreading so as to be widely dissipated into the substrate. Therefore, the heat dissipation of the substrate is enhanced.

The fourth semiconductor laser apparatus preferably comprises a reflection mirror, which is formed on the substrate and reflects a laser light emitted from the semiconductor laser element, in a direction substantially vertical to the main surface of the substrate. The reflection mirror, together with the light sensor formed on the substrate in order to detect the light incident from outside, make the optical axis of the laser light reflected by the reflection mirror be substantially parallel with the optical axis of the light incident from outside. Consequently, the semiconductor laser apparatus is efficiently combined with an external optical device.

In the fourth semiconductor laser apparatus, it is preferable that the thickness of the heat dissipating body layer is 50 μm or less. When the thickness is over 50 μm, the stress resulting from the difference in the coefficient of thermal expansion between the heat dissipating body layer and the semiconductor laser element grows, which deteriorates the semiconductor laser element. However, when the thickness is 50 μm or less, the influence of the differential thermal expansion is negligible.

In the fourth semiconductor laser apparatus, it is preferable that the heat dissipating body layer is composed of a metal. The use of a metal, which has relatively high thermal conductivity, facilitates the process of the heat dissipating body layer and ensures the improvement of the heat dissipation of the substrate.

In the fourth semiconductor laser apparatus, it is preferable that the constituent element of the heat dissipating body layer is carbon. For example, when diamond whose constituent element is carbon is used, the heat dissipation of the substrate is further enhanced because diamond has higher thermal conductivity than a metal and smaller differential coefficient of thermal expansion. In addition, the heat dissipating body layer which is in the form of a thin film can be produced and processed more easily.

DETAILED DESCRIPTION OF THE INVENTION

After hard study, the inventors of the present invention have found the following two points. The first point is that in a laser mount to which a semiconductor laser element is secured or in a semiconductor substrate to which a semiconductor laser element is secured, on which circuit elements such as an optical sensor are formed, and which serves as a laser mount, when a difference in coefficient of thermal expansion between the semiconductor laser element and a substratum coming contact with the semiconductor laser element is not greater than about $4\times10^{-6}$/K, the stress applied to the semiconductor laser element is manageable. The second point is that when a difference in coefficient of thermal expansion between the semiconductor laser element and the substratum coming contact with the semiconductor laser element is as large as about $12\times10^{-6}$/K, the stress applied to the semiconductor laser element due to the difference in coefficient of thermal expansion can be reduced by setting the thickness of the substratum coming contact with the semiconductor laser element to 50 μm or less.

First Embodiment

The following is a description of a first embodiment of the present invention, based on the drawings.

Figure 1:
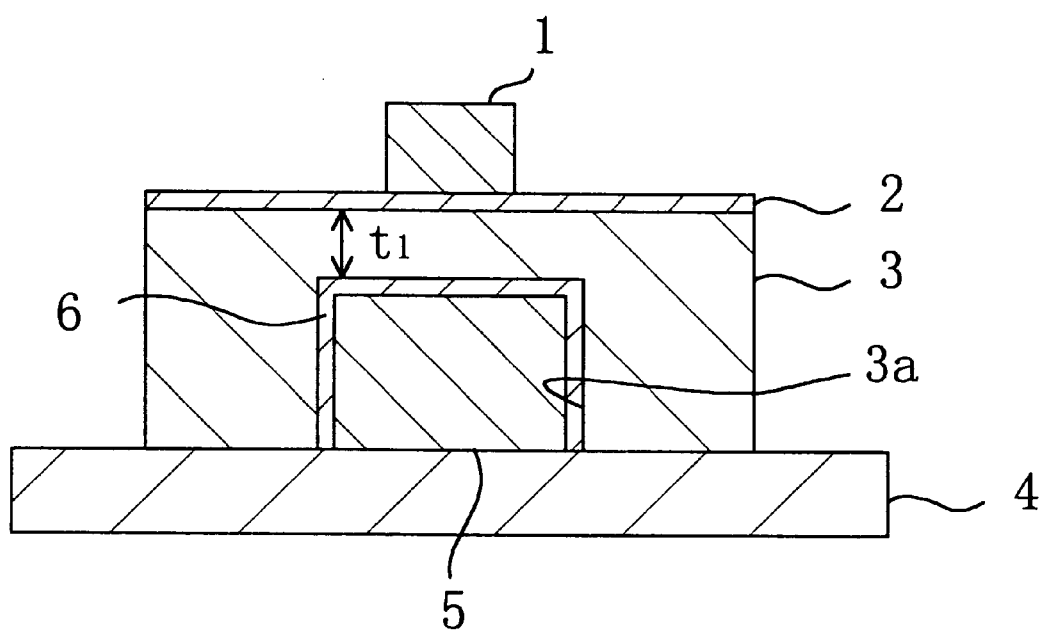
FIG. 1 is a section view illustrating the arrangement of a semiconduct or laser apparatus according to a first embodiment of the present invention.

FIG. 1 is a section view illustrating the arrangement of the semiconductor laser apparatus according to the first embodiment of the present invention. As shown in FIG. 1, the semiconductor laser apparatus comprises a semiconductor laser element 1 which is composed of a compound semiconductor consisting of GaAs or the like, a silicon (Si) laser mount 3 which is disposed under the semiconductor laser element 1 so as to position the element 1 and on which an electrode layer 2 is formed as an electrode of the semiconductor laser element 1, and a heat sink 4, which is disposed beneath the laser mount 3 and which dissipates heat generated by the semiconductor laser element 1 through the laser mount 3. The semiconductor laser element 1, the laser mount 3, and the heat sink 4 are mutually secured through hot contact bonding with the use of solder or the like.

The laser mount 3 has a concave portion 3a on the side opposite to the main surface to which the semiconductor laser element 1 is secured. The concave portion 3a contains a heat dissipating body 5 which is integrated thereinto and made of copper (Cu) having higher thermal conductivity than silicon. The entire inner side and bottom surfaces of the concave portion 3a are coated with a metallic layer 6 which serves as an electrode for electroplating the heat dissipating body 5. The thickness t1 of the bottom of the concave portion 3a of the laser mount 3 is 80 μm.

The method of producing the semiconductor laser apparatus according to the present embodiment will be described as follows with reference to the drawings.

Figure 2A:
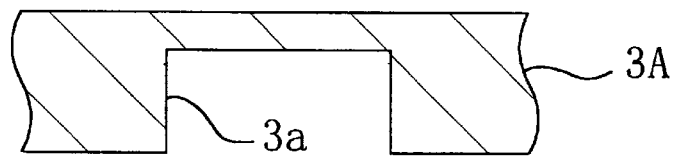
FIGS. 2(a)–2(d) are section views successively illustrating the seeps of a method of producing the semiconductor laser apparatus according to the first embodiment of the present invention.

FIGS. 2(a)–2(d) are section views successively illustrating the steps of the method of producing the semiconductor laser apparatus according to the present embodiment. As shown in FIG. 2(a), a resist pattern, which has an opening on the side opposite to the main surface of a silicon semiconductor substrate 3A, is formed by using a photolithography. The semiconductor substrate 3A is etched by using the resist pattern as a mask, so as to form the concave portion 3a.

Figure 2B:
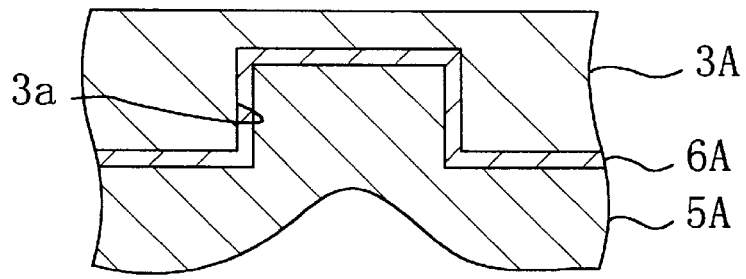

As shown in FIG. 2(b), the surface on the side opposite to the main surface of the semiconductor substrate 3A and the entire inner surface of the concave portion 3a are coated with a metal film 6A by using a vacuum evaporation process or the like. The metal film 6A is used as an electrode for electroplating, so as to form a copper metal layer 5A.

Figure 2C:
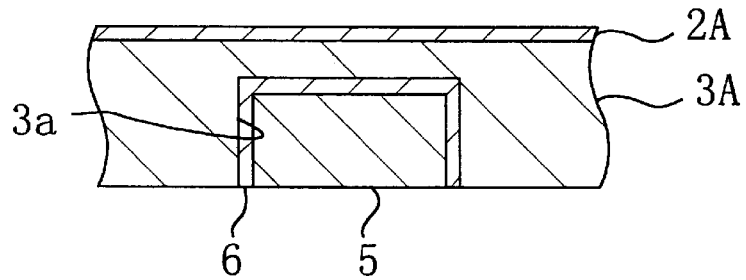

As shown in FIG. 2(c), a grinding operation is applied to the side opposite to the main surface of the semiconductor substrate 3A until the surface coated with the metal film 6A is exposed so as to make the copper heat dissipating body 5 be integrated into the concave portion 3a with the metal layer 6 therebetween. Then, a metal electrode forming layer 2A is formed on the entire main surface of the semiconductor substrate 3A by the vacuum evaporation process. Thus, the previous elimination of the metal layer 5A, which is made of stretchy copper, by a grinding operation prevents the occurrence of burrs when the laser mount 3 is cut down from the semiconductor substrate 3A in a later process.

Figure 2D:
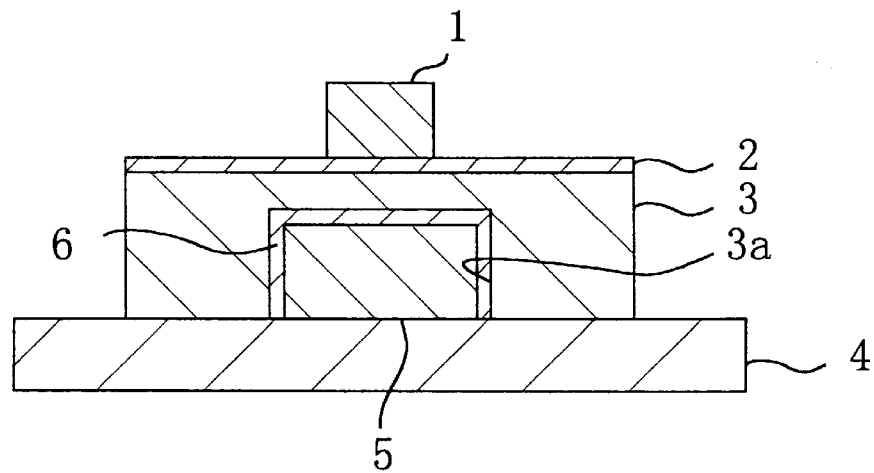

As shown in FIG. 2(d), the semiconductor substrate 3A is formed into the laser mount 3 having a predetermined size, and the electrode forming layer 2A on the semiconductor substrate 3A is formed into an electrode layer 2. Then, the semiconductor laser element 1 is secured to the top surface of the electrode layer 2 formed on the laser mount 3, through hot contact bonding with the use of solder or the like. In the same manner, the laser mount 3 is secured to the heat sink 4.

As described hereinbefore, according to the semiconductor laser apparatus of the present embodiment, the heat dissipating body 5, which is made of copper having higher thermal conductivity than the silicon laser mount 3, is integrated into the concave portion 3a of the laser mount 3. As a result, the heat dissipating body 5 serves to improve the heat dissipation of the laser mount 3.

In addition, the stress of the laser mount 3 with respect to the semiconductor laser element 1 is sufficiently small because the coefficient of thermal expansion between the semiconductor laser element 1 which is composed of a compound semiconductor consisting of GaAs or the like and the silicon laser mount 3 is small.

Figure 3:
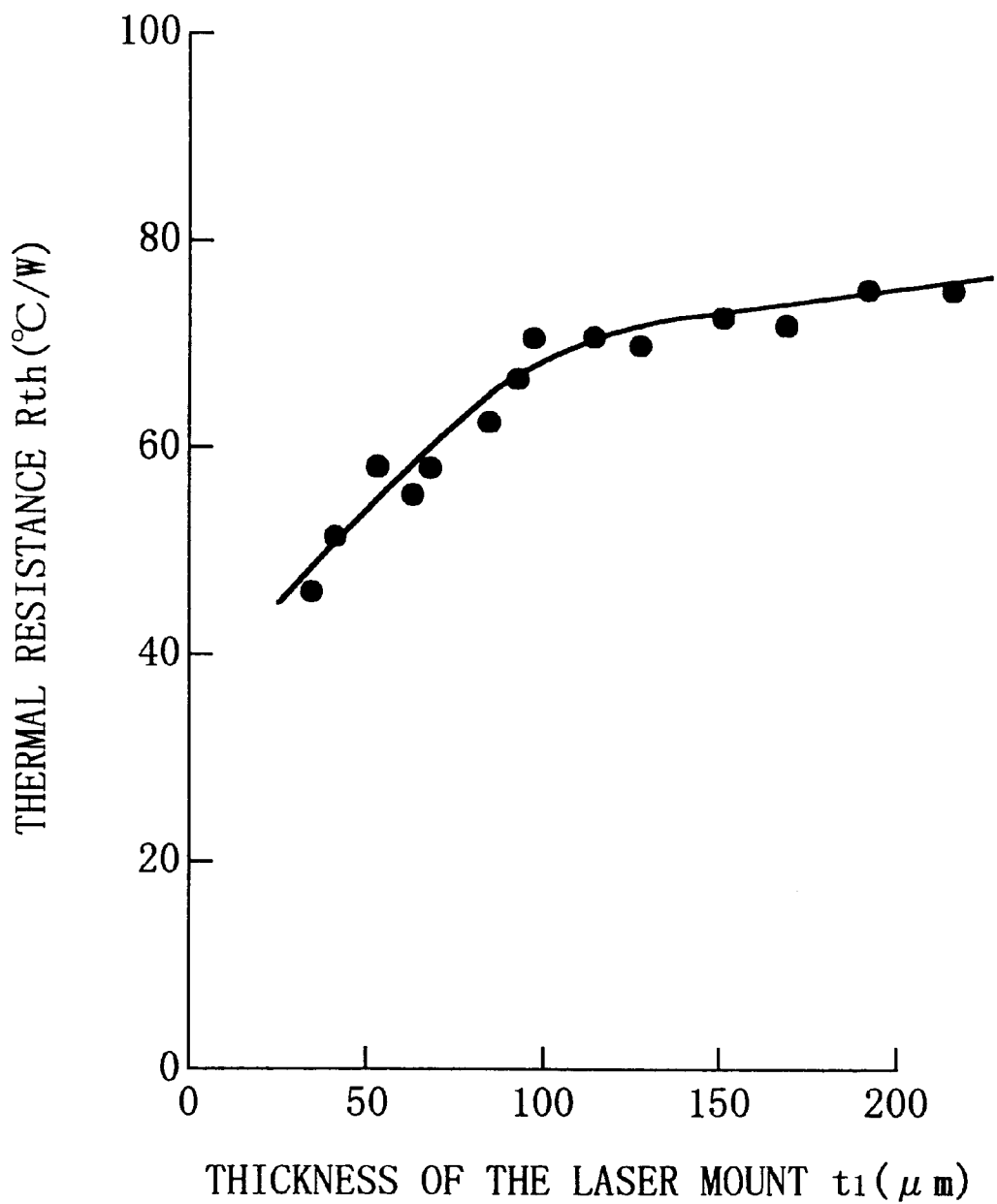
FIG. 3 is a graph illustrating the relationship between thermal resistance and the thickness of the bottom of the concave portion of a laser mount in the semiconductor laser apparatus according to the first embodiment of the present invention.

FIG. 3 shows the results of a first experiment concerning the relationship between the thickness t1 of the bottom of the concave portion 3a of the laser mount 3 and a thermal resistance Rth which is in inverse proportion to the thermal conductivity in the semiconductor laser apparatus according to the present embodiment in which the semiconductor laser element 1 is composed of a GaAlAs semiconductor. The results shown in FIG. 3 indicate that the thermal resistance of the semiconductor laser apparatus becomes smaller as the thickness t1 of the bottom of the concave portion 3a of the laser mount 3 gets smaller. This is because the heat dissipating body 5 has higher thermal conductivity than the laser mount 3. When the thickness t1 of the bottom of the concave portion 3a of the laser mount 3 is 100 μm or below, the thermal resistance of the semiconductor laser apparatus rapidly decreases. The semiconductor laser apparatus which is shown in FIG. 1 as the first prior art has thermal resistance of about 80° C./W, whereas the semiconductor laser apparatus of the present embodiment has thermal resistance of 70° C./W or below, which indicates the improvement of the heat dissipation of the laser mount 3.

On the other hand, when the thickness t1 of the bottom of the concave portion 3a of the laser mount 3 is less than 20 μm, the stress resulting from the difference in the coefficient of thermal expansion between the laser mount 3 and the heat dissipating body 5 causes the laser mount 3 to become warped or to crack. Hence, it is preferable that the thickness t1 of the bottom of the concave portion 3a is in a range of between 20 μm and 100 μm.

Figure 4:
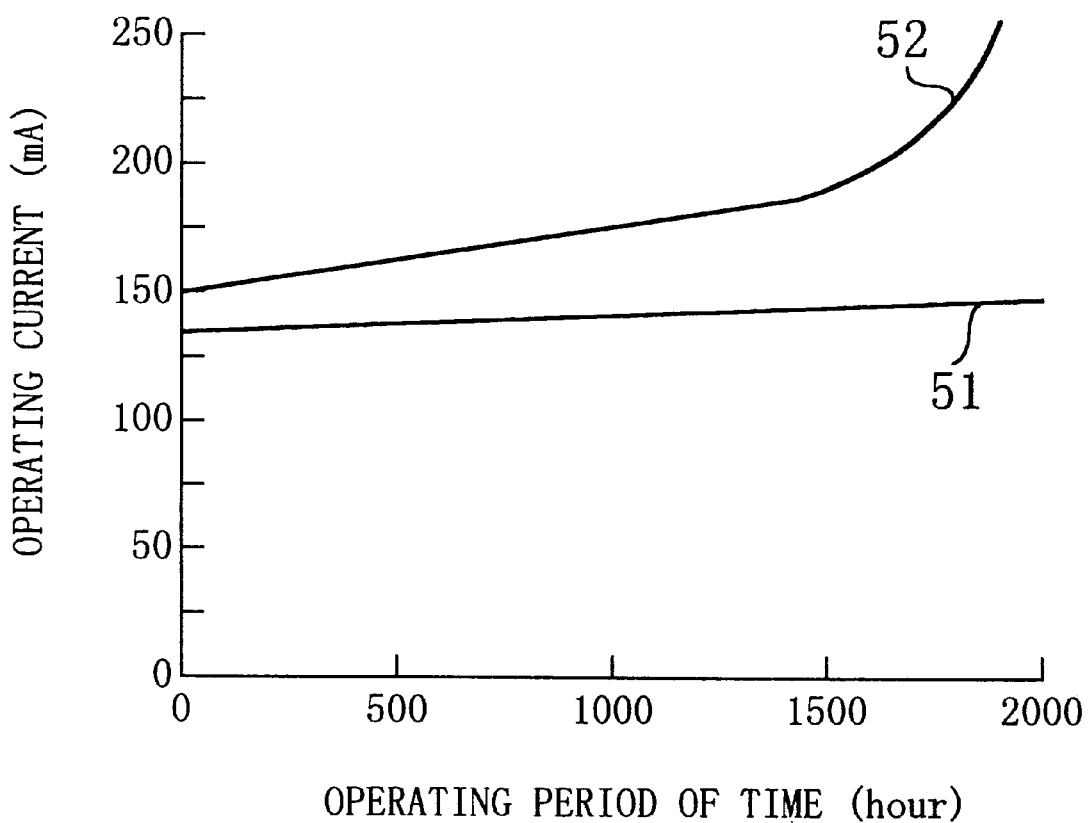
FIG. 4 is a graph illustrating the relationship between the operating current and the operating period of time of each semiconductor laser apparatus according to the first embodiment of the present invention and the first prior art.

FIG. 4 shows the results of a second experiment concerning the change in the operating current when each semiconductor laser apparatus according to the first embodiment of the present invention and the first prior art is operated under the conditions of an operational temperature of 70° C. and an output power of 80 mW. As shown in FIG. 4, in the semiconductor laser apparatus of the first prior art as indicated by the curve 52, the operational current rapidly increases when the operating period of time exceeds 1,500 hours, thereby deteriorating the semiconductor laser element 101. On the other hand, in the semiconductor laser apparatus of the present embodiment as indicated by the curve 51, a safe operation is continued for more than 2,000 hours. This reveals that it is effective to provide the heat dissipating body 5 inside the laser mount 3 in order to improve the heat dissipation.

The feature of the semiconductor laser apparatus of the present embodiment is that the heat dissipating body 5 is entirely covered with the laser mount 3 except the surface in contact with the heat sink 4, so that the laser mount 3 and the heat dissipating body 5 are prevented from entirely coming off from each other, though they may come off partially.

Figure 15:
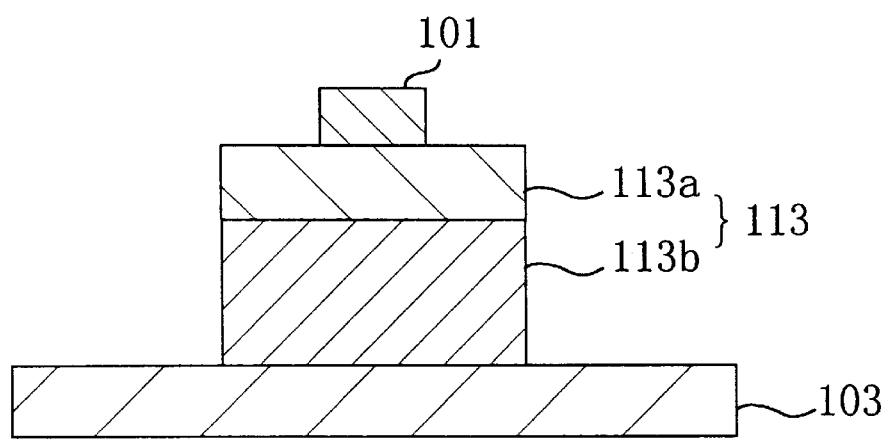
FIG. 15 is a section view illustrating the arrangement of the semiconductor laser apparatus of third prior art.

In addition, the heat dissipating body 5, which corresponds to the lower diamond layer 113*b* in the semiconductor laser apparatus shown in FIG. 15 as the third prior art, is integrated into the laser mount 3, which prevents an increase in the number of the component elements. Furthermore, the use of a highly processible metal reduces the costs of components and assembling.

Second Embodiment

The following is a description of a second embodiment, based on the drawings.

Figure 5:
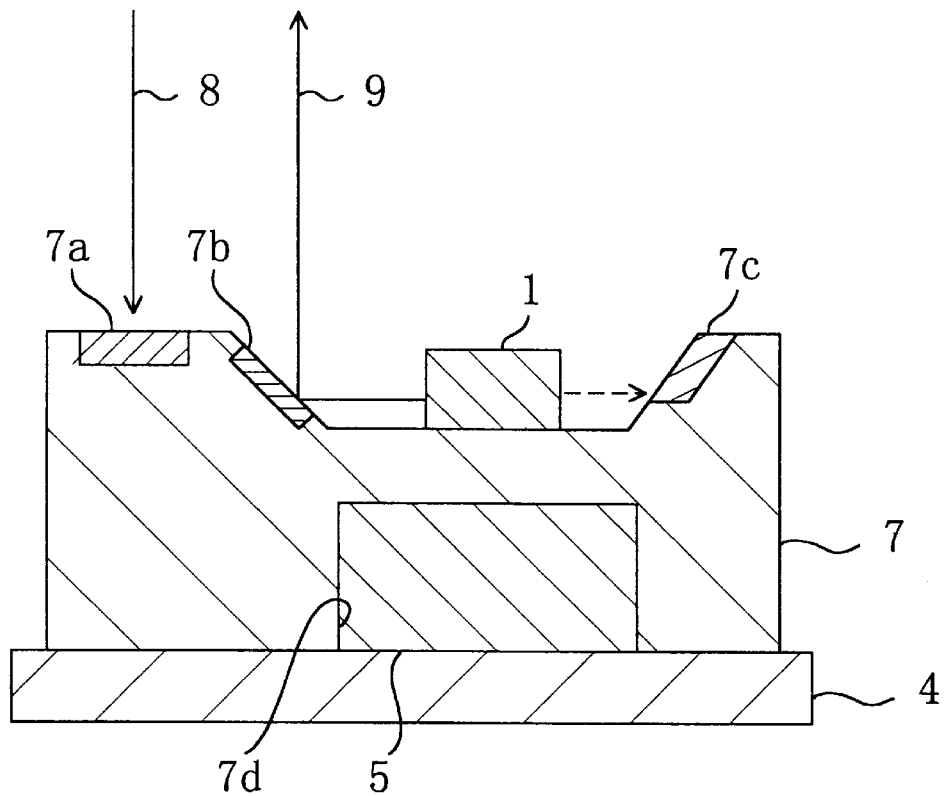
FIG. 5 is a section view illustrating the arrangement of a semiconductor laser apparatus according to a second embodiment of the present invention.

FIG. 5 is a section view illustrating the arrangement of a semiconductor laser apparatus according to the second embodiment of the present invention. As shown in FIG. 5, the apparatus comprises a heat sink 4, a silicon semiconductor substrate 7, which is provided on the heat sink 4 and has a first concave portion whose inner walls are so inclined as to form an inverse trapezoid, and a semiconductor laser element 1, which is disposed on the bottom of the first concave portion of the semiconductor substrate 7. These members 4, 7, and 1 are mutually secured through hot contact bonding with the use of solder or the like.

Formed on a top of the concave portion of the semiconductor substrate 7 is an optical sensor 7*a*, which detects a light 8 externally incident thereupon. A reflection mirror 7*b*, which reflects a laser light 9, is formed on that inclined inner wall of the first concave portion in the semiconductor substrate 7 which is located on the side of the optical sensor 7*a*. The laser light 9 is emitted from the semiconductor laser element 1 in a direction substantially in parallel with the main surface of the semiconductor substrate 7 and reflected by the reflection mirror 7*b* in a direction substantially vertical to the main surface of the semiconductor substrate 7.

A laser light sensor 7*c*, which monitors the operation of the semiconductor laser element 1, is formed on that inclined inner wall of the first concave portion of the semiconductor substrate 7 which is located on the side opposite to the optical sensor 7*a*. By setting the angle of inclination of the inner walls of the first concave portion so that the optical axis of the laser light 9 reflected by the reflection mirror 7*b* is substantially parallel with the optical axis of the externally incident light 8, the semiconductor laser apparatus can be efficiently combined with an external optical device (not shown). The semiconductor substrate 7 is further provided with such unillustrated members as an amplifier circuit for amplifying a signal supplied from the optical sensor 7*a* and outputting the amplified signal, an operating circuit for performing operation on the signal supplied from the amplifier circuit, and a drive circuit for driving the semiconductor laser element 1.

The feature of the present embodiment is as follows. The semiconductor substrate 7, which is provided as a laser mount and for arranging circuit elements, has a second concave portion 7*d* whose bottom has a thickness of 80 $\mu$m on the side opposite to the main surface to which the semiconductor laser element 1 is secured. The second concave portion 7*d* contains the heat dissipating body 5 which is integrated thereinto and made of copper (Cu) having thermal conductivity higher than silicon. Hence, the semiconductor substrate 7 is freed from the stress with respect to the semiconductor laser element 1 with which it is in contact, and the heat dissipating body 5, which is integrated into the second concave portion 7*d*, improves the heat dissipation of the semiconductor substrate 7. As a result, the semiconductor laser element 1 becomes more durable.

Another feature of the present embodiment is that the opening side of the second concave portion 7*d* is sealed with and secured to the heat sink 4, so that there is no fear of the heat dissipating body 5 coming off.

In addition, the semiconductor laser device of the present embodiment can be miniaturized by integrating circuit elements including the light detector 7*a* on the semiconductor substrate 7 which also serves as a laser mount. As a result, such an apparatus as a light pickup which uses a semiconductor laser device can be downsized.

Third Embodiment

The following is a description of a third embodiment, based on the drawings.

Figure 6:
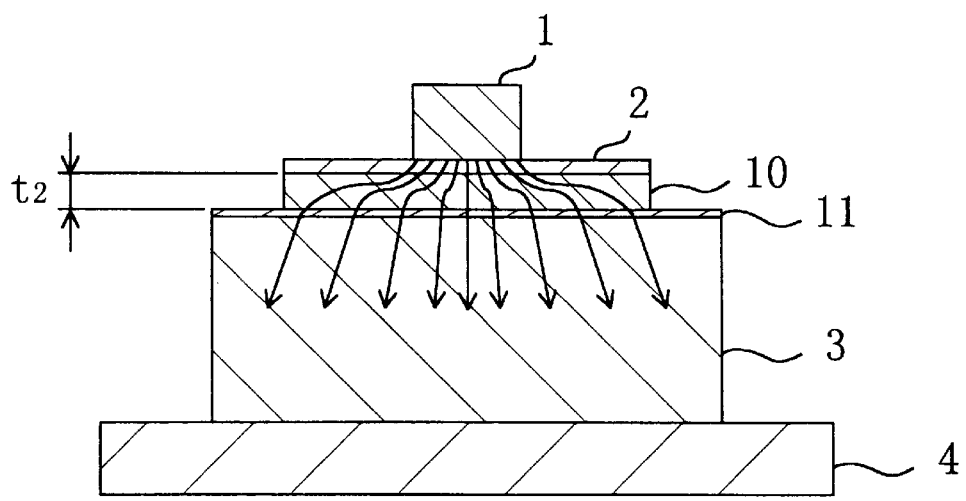
FIG. 6 is a section view illustrating the arrangement of a semiconductor laser apparatus according to a third embodiment of the present invention.

FIG. 6 is a section view illustrating the arrangement of a semiconductor laser apparatus according to the third embodiment of the present invention. As shown in FIG. 6, the apparatus comprises a semiconductor laser element 1, which is composed of a compound semiconductor consisting of GaAs or the like, a 50 $\mu$m-thick heat dissipating body layer 10, which is made of copper (Cu) and disposed under the semiconductor laser element 1, and on which an electrode layer 2 is formed as an electrode of the semiconductor laser element 1, a silicon laser mount 3, which positions the semiconductor laser element 1 and on which a metal layer 11 is formed, and a heat sink 4, which is disposed beneath the laser mount 3 and which dissipates heat generated by the semiconductor laser element 1 through the heat dissipating body layer 10 and the laser mount 3. The semiconductor laser element 1 and the electrode layer 2 are secured to each other, and in the same manner the laser mount 3 and the heat sink 4 are secured to each other through hot contact bonding using solder or the like.

Thus, the heat dissipating body layer 10 made of copper whose thermal conductivity is higher than silicon is in contact with the semiconductor layer element 1, with the electrode layer 2 therebetween. As a result, the heat dissipation of the laser mount 3 is improved, as compared with the semiconductor laser apparatus of the first prior art. The reason for this is that the heat generated in the semiconductor laser element 1 is absorbed by the heat dissipating body layer 10, and then dispersed in the direction of the heat dissipating body layer 10 spreading, as indicated by the several curves with downward arrows. As a result, the heat is widely dissipated into the laser mount 3.

Furthermore, the use of highly processible copper as the heat dissipating body layer 10 allows the heat dissipating body layer 10 to be formed on the laser mount 3 by a plating process. As a result, a high-performing semiconductor laser apparatus with improved durability can be obtained at low cost, by using the highly processible laser mount 3.

The difference in coefficient of thermal expansion between the copper heat dissipating body layer 10 and the GaAs semiconductor laser element 1 is larger than the difference in coefficient of thermal expansion between the Si laser mount 3 and the semiconductor laser element 1. For this reason, the stress applied to the semiconductor laser element 1 may seem to be slightly larger than in the apparatus as the first prior art; however, in fact, the stress is small enough because the thickness t2 of the heat dissipating body layer 10 is as small as 50 $\mu$m.

The method of producing the semiconductor laser apparatus according to the present embodiment will be described as follows with reference to the drawings.

Figure 7A:
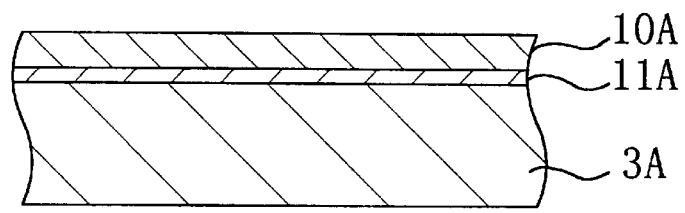
FIGS. 7(a)–7(c) are section view so successively illustrating the steps of a method of producing the semiconductor laser apparatus according to the third embodiment of the present invention.
Figure 7B:
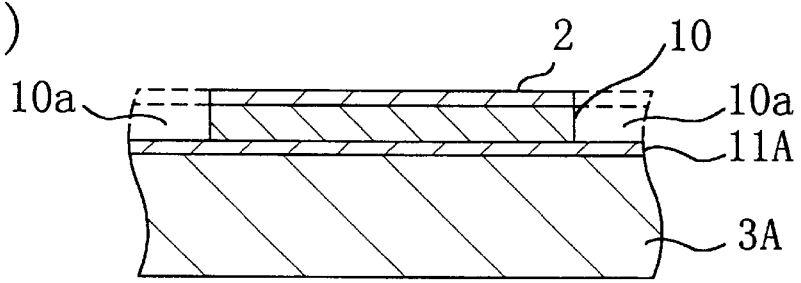
Figure 7C:
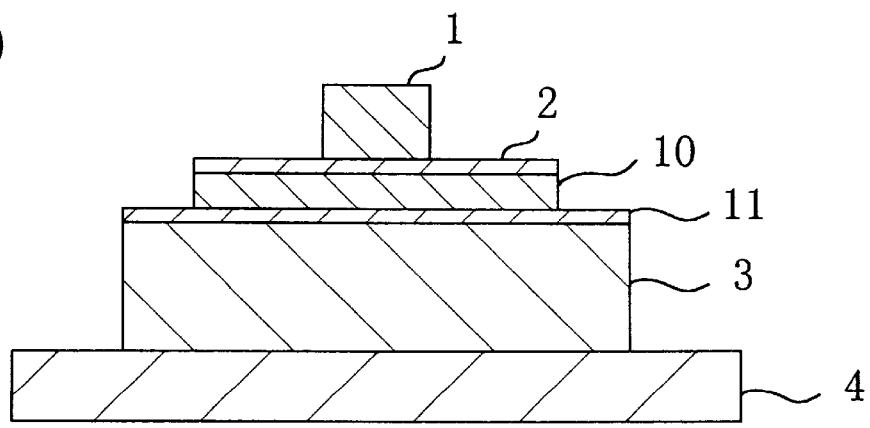

FIGS. 7(a)–7(c) are section views successively illustrating the steps of the method. As shown in FIG. 7(a), a metal layer 11A is formed on the entire surface of the silicon semiconductor substrate 3A by a vacuum evaporation process or the like, and a copper heat dissipating body formation layer 10A is plated on the entire surface of the metal layer 11A.

As shown in FIG. 7(b), an electrode formation layer 2A is formed, by vacuum evaporation, on the entire surface of the heat dissipating body formation layer 10A, which is formed on the semiconductor substrate 3A. Then, before the laser mount 3 is cut down from the semiconductor substrate 3A, the cutting edge 10a of the electrode formation layer 2A and the heat dissipating body formation layer 10A is eliminated by etching. Such previous formation of the heat dissipating body layer 10 which is made of stretchy copper can prevent the occurrence of burrs in a process of cutting down the laser mount 3 from the semiconductor substrate 3A. In fact, the inventors of the present invention have confirmed that the previous elimination of the cutting edge 10a improves the processing yield of the laser mount 3 by about 30%, as compared with the case where the cutting edge 10a is not eliminated. Then, as shown in FIG. 7(c), by using a solder or the like, the semiconductor laser element 1 is secured on a predetermined position of the heat dissipating body layer 10 provided on the laser mount 3 which is formed from the semiconductor substrate 3A. The laser mount 3 is secured on a predetermined position of the heat sink 4.

Figure 8:
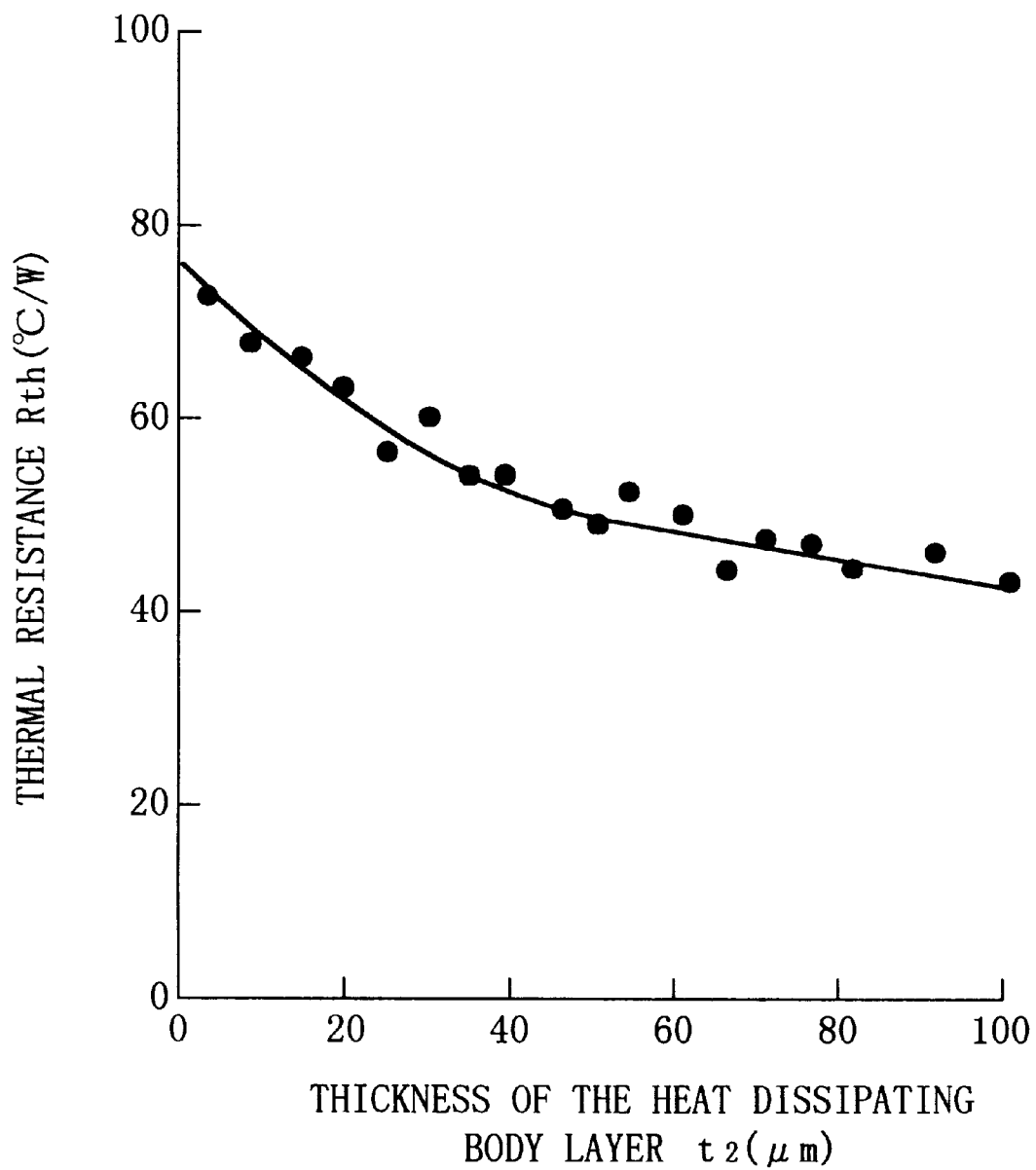
FIG. 8 is a graph illustrating the relationship between thermal resistance and the thickness of the heat dissipating body layer of the semiconductor laser apparatus according to the third embodiment of the present invention.
Figure 13:
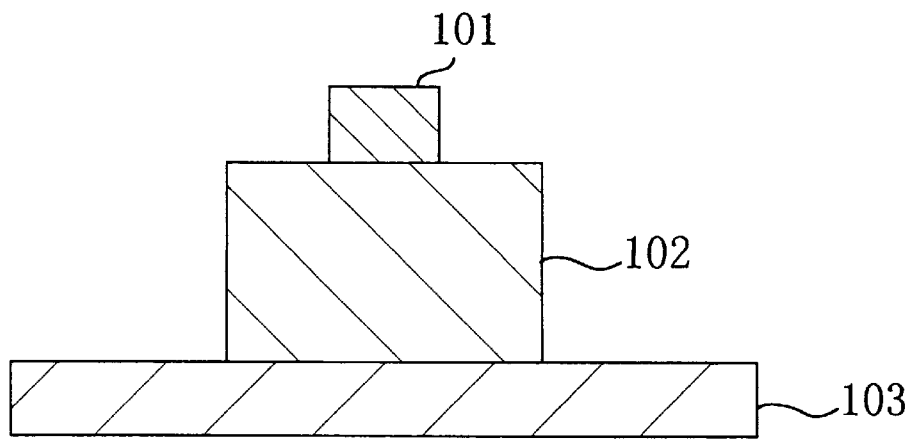
FIG. 13 is a section view illustrating the arrangement of the semiconductor laser apparatus of first prior art.
Figure 14:
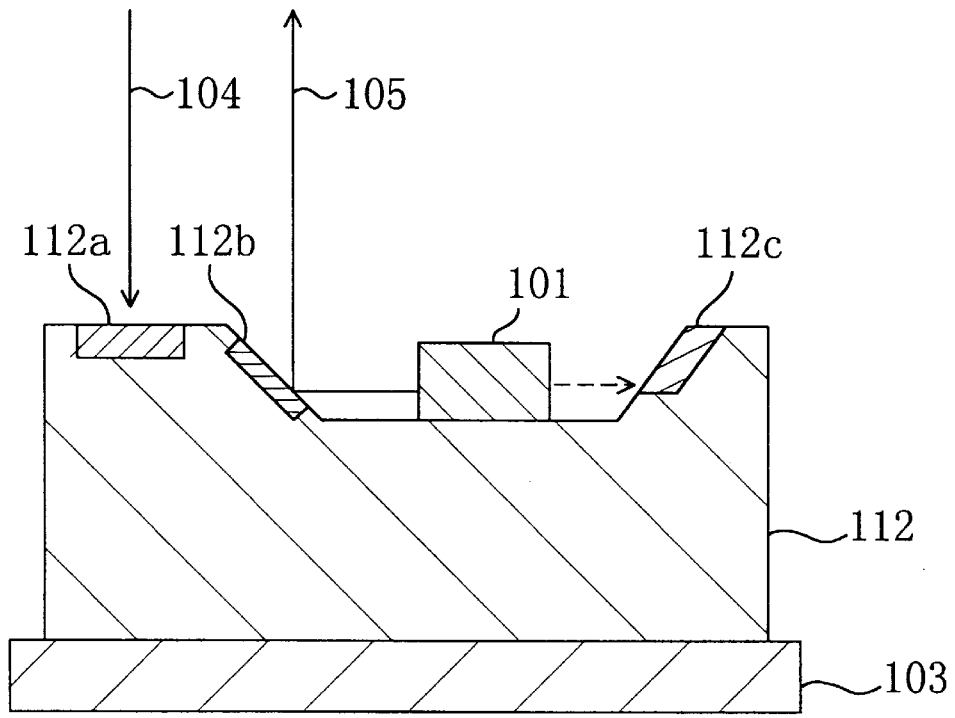
FIG. 14 is a section view illustrating the arrangement of the semiconductor laser apparatus of second prior art.

FIG. 8 shows the results of a third experiment concerning the relationship between thermal resistance Rth and the thickness t2 of the heat dissipating body layer 10 on the laser mount 3 in the semiconductor laser apparatus according to the present embodiment, where a GaAlAs semiconductor is used as the semiconductor laser element 1. The results of FIG. 8 indicate that the thermal resistance Rth of the semiconductor laser apparatus becomes smaller as the thickness t2 of the heat dissipating body layer 10 on the laser mount 3 increases. As compared with the fact that the semiconductor laser apparatus shown in FIG. 13 as the first prior art has thermal resistance of about 80° C./W as mentioned earlier, the thermal resistance of the apparatus according to the present embodiment is small even when the thickness t2 of the heat dissipating body layer 10 is extremely small. This indicates the improvement of the heat dissipation.

Figure 9:
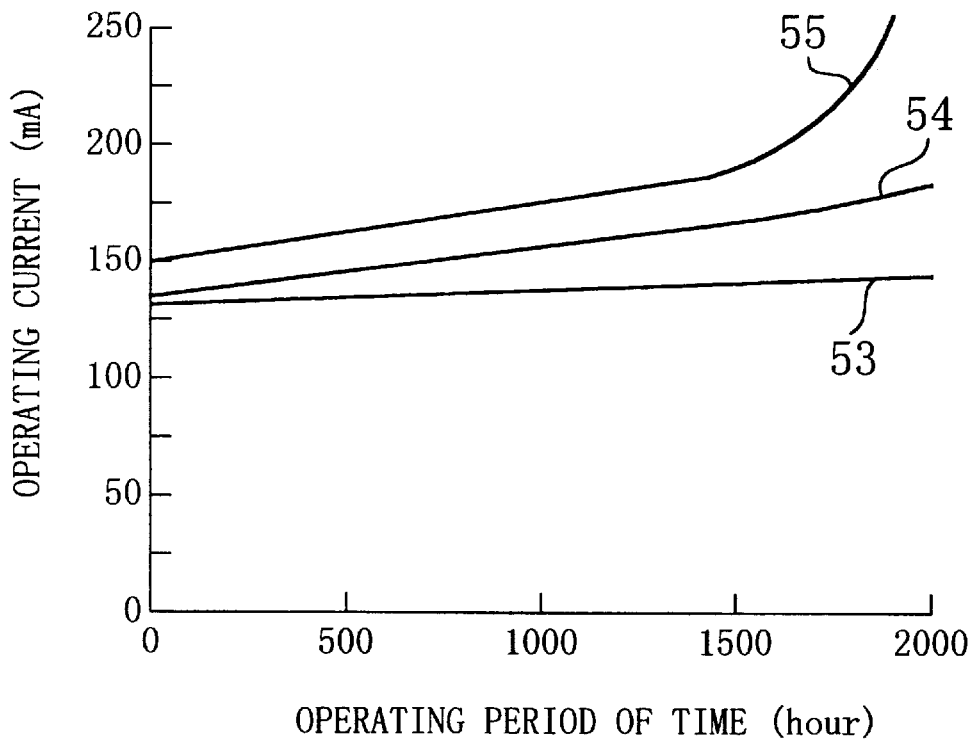
FIG. 9 is a graph illustrating the relationship between the operating current and the operating period of time of each semiconductor laser apparatus according to the third embodiment of the present invention and the first prior art.

FIG. 9 shows the results of a fourth experiment concerning the operating current when each semiconductor laser apparatus according to the present embodiment and the first prior art is operated under the conditions of an operational temperature of 70° C. and an output power of 80 mW. The curves 53 and 54 represent the semiconductor laser apparatus according to the present embodiment where the thickness t2 of the heat dissipating body layer 10 is set to 50 $\mu$m and 80 $\mu$m, respectively. The curve 55 represents the semiconductor laser apparatus as the first prior art.

As the curve 55 shows, the operational current rapidly increases when the operating period of time passes 1,500 hours, thereby deteriorating the semiconductor laser element 101 in the semiconductor laser apparatus of the first prior art. In contrast, the semiconductor laser apparatus of the present embodiment successfully continues a safe operation for more than 2,000 hours as the curve 53 shows. When the thickness t2 of the heat dissipating body layer 10 is 80 $\mu$m, the operation is stable, but the operating current has a large increase rate as the curve 54 shows. The reason for this is that when the thickness of the heat dissipating body layer 10 is over 50 $\mu$m, the stress resulting from the difference in the coefficient of thermal expansion between the heat dissipating body layer 10 and the semiconductor laser element 1 grows, which deteriorates the semiconductor laser element 1.

The formation of a barrier layer (not shown) between the heat dissipating body layer 10 and the electrode layer 2 can improve the securing strength between the semiconductor laser element 1 and the laser mount 3, which reduces the contact thermal resistance on the bonding interface.

Figure 10:
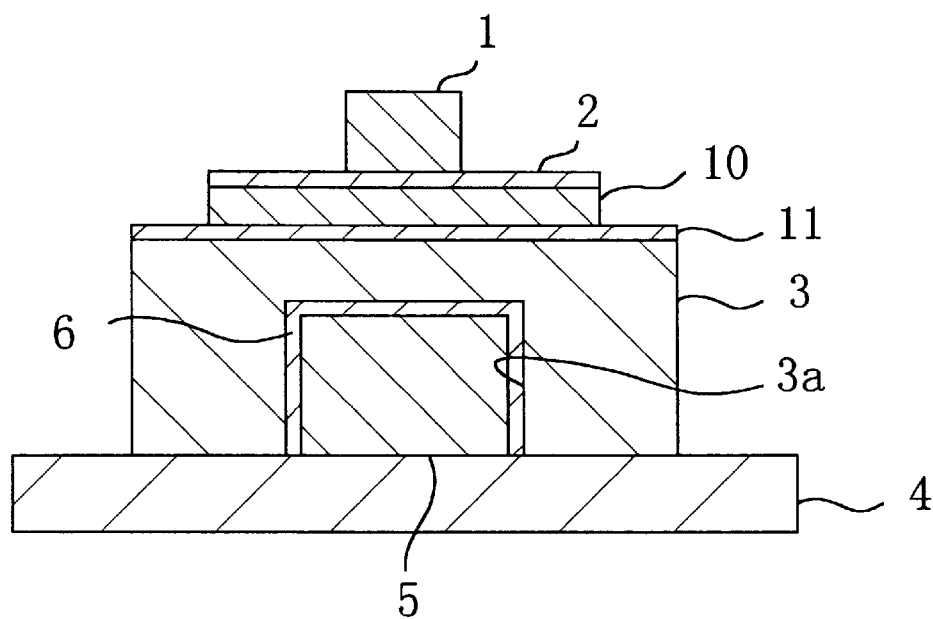
FIG. 10 is a section view illustrating the arrangement of the semiconductor laser apparatus according to a modification of the third embodiment of the present invention.

As shown in FIG. 10, it is needless to say that a semiconductor laser apparatus with higher heat dissipation can be obtained by providing the heat dissipating body 5 according to the first embodiment under the laser mount 3 and further providing the heat dissipating body layer 10 according to the present embodiment between the semiconductor laser element 1 and the laser mount 3. In FIG. 10, the same members as those shown in FIGS. 1 and 6 are assigned the common reference numbers, and their description is omitted.

Fourth Embodiment

The following is a description of a fourth embodiment of the present invention, based on the drawings.

Figure 11:
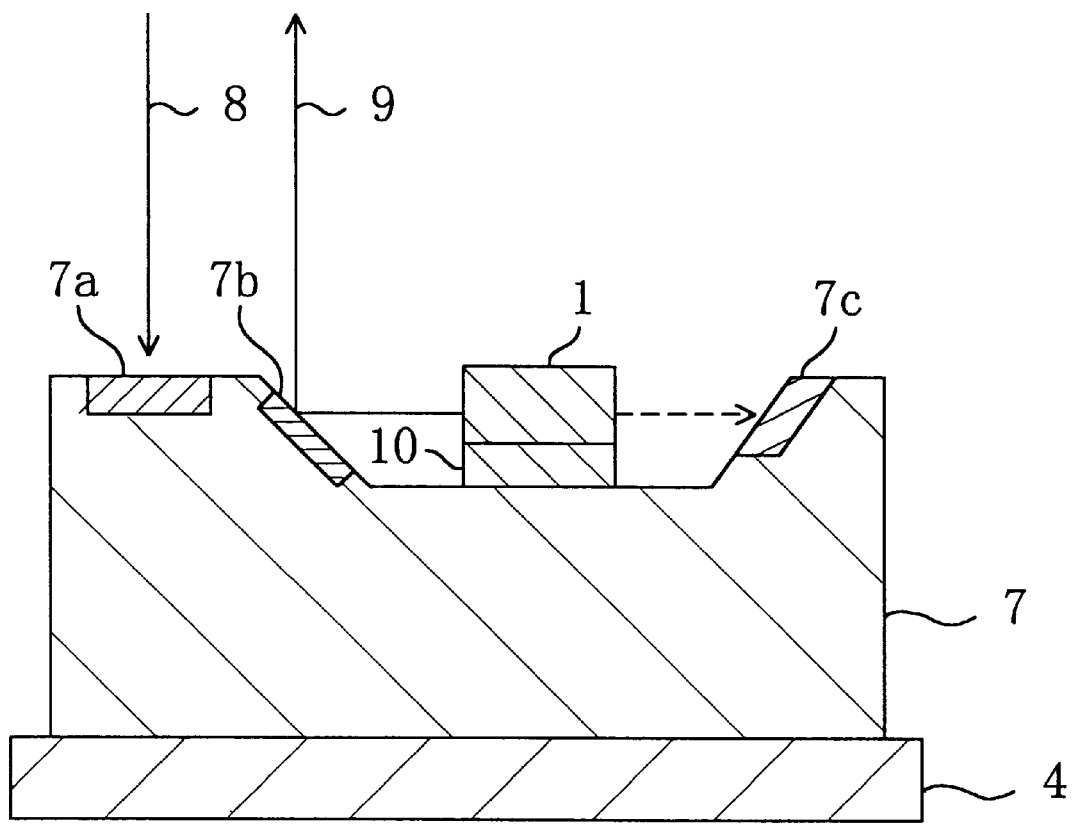
FIG. 11 is a section view illustrating the arrangement of the semiconductor laser apparatus according to a fourth embodiment of the present invention.

FIG. 11 is a section view illustrating the arrangement of the semiconductor laser apparatus according to the fourth embodiment of the present invention. In FIG. 11, the same members as those shown in FIG. 5 are assigned the common reference numbers and their description is omitted.

The feature of the present embodiment is that the 50 $\mu$m-thick heat dissipating body layer 10 made of copper is formed between the semiconductor laser element 1 and the semiconductor substrate 7, in place of the heat dissipating body 5 which is integrated into the semiconductor substrate 7 having a function as the laser mount of the second embodiment. As a result, the heat generated in the semiconductor laser element 1 is absorbed by the heat dissipating body layer 10, and then dispersed into the semiconductor substrate 7, so as to be widely dissipated into the semiconductor substrate 7. Thus, the apparatus of the present embodiment becomes more durable.

The semiconductor substrate 7 is further provided with such unillustrated members as an amplifier circuit for amplifying a signal supplied from the optical sensor 7a and outputting the amplified signal, an operating circuit for performing operation on the signal supplied from the amplifier circuit, and a drive circuit for driving the semiconductor laser element 1. As a result, the semiconductor laser device can be miniaturized, and such an apparatus as a light pickup which uses the semiconductor laser device can be downsized.

By setting the angle of inclination of the inner walls of the concave portion so that the optical axis of the laser light 9 reflected by the reflection mirror 7b is substantially parallel with the optical axis of the externally incident light 8, the semiconductor laser apparatus can be efficiently combined with an external optical device.

Figure 12:
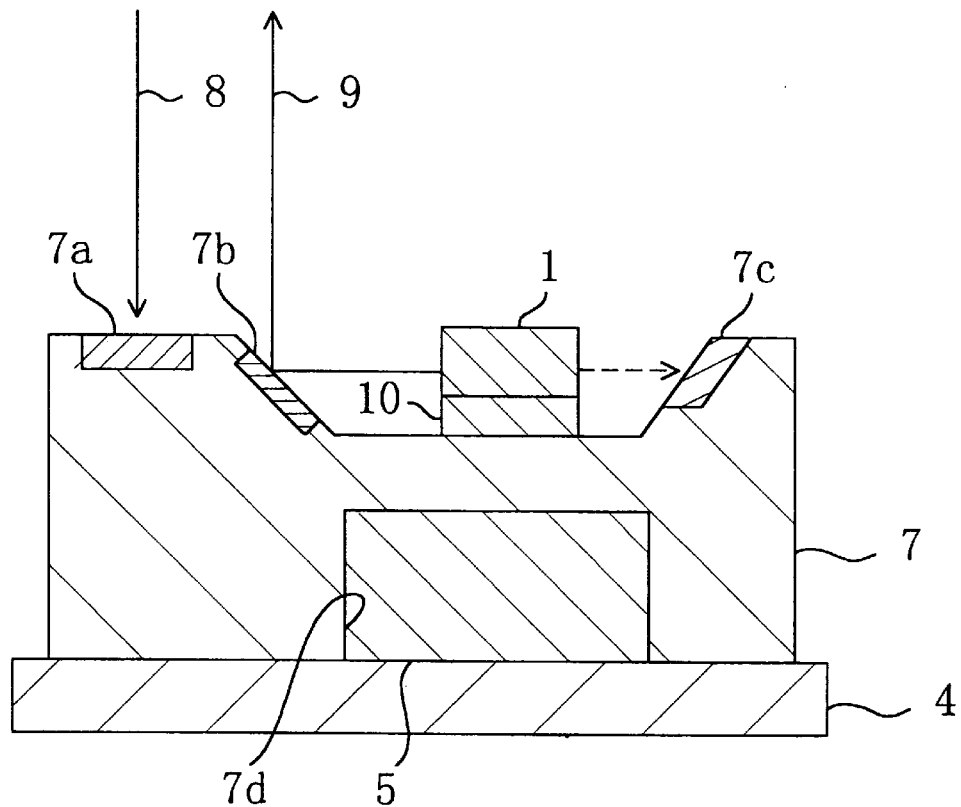
FIG. 12 is a section view illustrating the arrangement of the semiconductor laser apparatus according to a modification of the fourth embodiment of the present invention.

As shown in FIG. 12, it is needless to say that a semiconductor laser apparatus with higher heat dissipation can be obtained by providing the heat dissipating body 5 according to the second embodiment under the semiconductor substrate 7 and further providing the heat dissipating body layer 10 according to the present embodiment between the semiconductor laser element 1 and the semiconductor substrate 7. In FIG. 12, the same members as those shown in FIGS. 5 and 11 are assigned the common reference numbers, and their description is omitted.

In each of the foregoing embodiments, the package of the heat sink 4 can be a can type, a lead frame type, or the like, and the material of the package has no limitation. Besides GaAs and GaAlAs, the material of the semiconductor laser element 1 can be composed of InGaAlP, InP, InGaAsP, ZnSe, ZnCdSSe, ZnMgSSe, GaN, InGaN, AlGaN, or the like.

Copper is used as the material of the heat dissipating body 5 which is integrated into the concave portion 3a of the laser mount 3 in the first embodiment or with the second concave portion 7d of the semiconductor substrate 7 in the second embodiment. Instead, a material which is composed of carbon (C) such as diamond may be selectively grown to form the heat dissipating body 5. By doing so, the heat dissipating body 5 has extremely high thermal conductivity, so that the heat dissipation of the semiconductor laser apparatus is greatly enhanced. In addition, gold (Au), silver (Ag), or other materials containing gold and silver may be used. In this case, the use of such a highly processible metallic material as gold and silver in place of copper facilitates the filling of the concave portion 3a or the second concave portion 7d by plating, flame spray coating, vacuum evaporation, or the like. Thus, the cost for processing the laser mount 3 or the semiconductor substrate 7 can be reduced.

In the third and fourth embodiments, copper is used for the heat dissipating body layer 10; however, a material which is composed of carbon such as diamond may be selectively grown to form the heat dissipating body layer 10. By doing so, the heat dissipating body layer 10 has extremely high thermal conductivity, so that the heat dissipation of the semiconductor laser apparatus is greatly enhanced. In addition, gold (Au), silver (Ag), or other materials containing gold and silver may be used for the heat dissipating body layer 10. When such a highly processible metallic material as gold or silver is used, the heat dissipating body layer 10 can be easily formed on the laser mount 3 or the semiconductor substrate 7 by plating, flame spray coating, vacuum evaporation, or the like, in the same manner as copper. Thus, the cost for processing the laser mount 3 or the semiconductor substrate 7 can be reduced.

In the first and third embodiments, silicon (Si) is used for the laser mount 3; however, silicon carbide (SiC), aluminum nitride (AlN), or the like may be used instead of Si, so as to improve the heat dissipation of the semiconductor laser apparatuses.

In the first and third embodiments, the semiconductor laser apparatus comprises the semiconductor laser 1, the laser mount 3, and the heat sink 4; however, the apparatus may further comprise the following components in a package as a heat sink: a laser light sensor for detecting a laser light emitted from either the output terminal of the semiconductor laser element 1 or the terminal on the other end, an optical sensor for detecting a light externally incident, an amplifier circuit for amplifying a signal supplied from the optical sensor and outputting the amplified signal, an operating circuit for performing operation on the signal supplied from the amplifier circuit, and a drive circuit for driving the semiconductor laser element.

In the second and fourth embodiments, silicon is used for the semiconductor substrate 7; however, the use of silicon carbide or the like in place of silicon can improve the heat dissipation of the semiconductor laser apparatus.

What is claimed is:

1. A semiconductor laser apparatus comprising:
   a laser mount; and
   a semiconductor laser element which is secured to a main surface of said laser mount with a metal layer interposed therebetween;
   wherein said laser mount has a concave portion on a side opposite to said main surface, and said concave portion contains a heat dissipating body having thermal conductivity higher than said laser mount, said heat dissipating body being integrated into said concave portion.

2. The semiconductor laser apparatus according to claim 1, wherein the dimension from said main surface to the bottom surface of said concave portion of said laser mount is between 20 $\mu$m and 100 $\mu$m, inclusive.

3. The semiconductor laser apparatus according to claim 1, wherein said heat dissipating body is composed of a metal.

4. The semiconductor laser apparatus according to claim 1, wherein said laser mount comprises a different material from a material comprised in said semiconductor laser element.

5. The semiconductor laser apparatus according to claim 1, wherein said laser mount comprises silicon or silicon carbide.

6. A semiconductor laser apparatus comprising:
   a substrate;
   a semiconductor laser element which is secured on a main surface of said substrate with a metal interposed therebetween through hot contact bonding; and
   a light sensor which is provided on said substrate, said light sensor detecting a light incident from outside;
   wherein said substrate has a concave portion on a side opposite to said main surface, and said concave portion contains a heat dissipating body having thermal conductivity higher than said substrate, said heat dissipating body being integrated into said concave portion.

7. The semiconductor laser apparatus according to claim 6, further comprising:
   a reflection mirror which is provided on said substrate, said reflection mirror reflecting a laser light in a direction approximately vertical to the main surface of said substrate, said laser light being emitted from said semiconductor laser element.

8. The semiconductor laser apparatus according to claim 6, wherein the dimension from said main surface to the bottom surface of said concave portion of said substrate is between 20 $\mu$m and 100 $\mu$m, inclusive.

9. The semiconductor laser apparatus according to claim 6, wherein said heat dissipating body is composed of a metal.

10. A semiconductor laser apparatus comprising:
    a substrate;
    a first heat dissipating body which is formed on a main surface of said substrate;
    a semiconductor laser element which is secured on said first heat dissipating body; and
    a light sensor which is provided on said substrate, said light sensor detecting a light incident from outside;
    wherein said substrate has a concave portion on a side opposite to said main surface, and said concave portion contains a second heat dissipating body having thermal conductivity higher than said substrate, said second heat dissipating body being integrated into said concave portion.

* * * * *